(12) United States Patent
Shimokawa

(10) Patent No.: US 7,989,324 B2
(45) Date of Patent: Aug. 2, 2011

(54) METHOD FOR MANUFACTURING SILICON ON SAPPHIRE WAFER

(75) Inventor: Kimiaki Shimokawa, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 0 days.

(21) Appl. No.: 12/458,321

(22) Filed: Jul. 8, 2009

(65) Prior Publication Data
US 2009/0275189 A1 Nov. 5, 2009

Related U.S. Application Data

(62) Division of application No. 11/377,394, filed on Mar. 17, 2006, now Pat. No. 7,564,100.

(30) Foreign Application Priority Data

Mar. 18, 2005 (JP) .............................. 2005-079742

(51) Int. Cl.
*H01L 21/20* (2006.01)
*H01L 21/36* (2006.01)

(52) U.S. Cl. ........ 438/479; 438/517; 438/791; 257/352; 257/635; 257/640; 257/E21.416; 257/E23.016

(58) Field of Classification Search ............... 438/479, 438/480, 517, 724, 744, 757, 791, 958; 257/352, 257/635, 640, E21.416, E23.016, E23.116
See application file for complete search history.

(56) References Cited

U.S. PATENT DOCUMENTS

| 5,877,094 A * | 3/1999 | Egley et al. .............. 438/763 |
| 5,985,771 A | 11/1999 | Moore et al. |
| 6,238,935 B1 | 5/2001 | Egley et al. |
| 2004/0092051 A1* | 5/2004 | Currie et al. ............... 438/22 |

FOREIGN PATENT DOCUMENTS

| JP | 57-153445 | 9/1982 |
| JP | 2000-36585 | 2/2000 |
| JP | 3083725 | 6/2000 |

* cited by examiner

*Primary Examiner* — Minh-Loan T Tran
*Assistant Examiner* — Leslie Pilar Cruz
(74) *Attorney, Agent, or Firm* — Rabin & Berdo, PC

(57) ABSTRACT

The present invention provides an SOS wafer comprising a non-transparent polysilicon layer provided on a back surface of a sapphire substrate, a silicon nitride layer which protects the polysilicon layer, and a stress relaxing film which cancels stress produced in the silicon nitride layer, wherein the silicon nitride layer and the stress relaxing film are provided on the back surface side.

1 Claim, 10 Drawing Sheets

EXPLANATORY VIEW SHOWING METHOD FOR MANUFACTURING SOS WAFER ACCORDING TO FIRST EMBODIMENT

EXPLANATORY VIEW SHOWING EDGE PORTION OF SOS WAFER ACCORDING TO FIRST EMBODIMENT

EXPLANATORY VIEW SHOWING METHOD FOR MANUFACTURING SOS WAFER ACCORDING TO FIRST EMBODIMENT

EXPLANATORY VIEW SHOWING EDGE PORTION OF SOS WAFER
ACCORDING TO FIRST EMBODIMENT

EXPLANATORY VIEW SHOWING METHOD FOR MANUFACTURING SOS WAFER ACCORDING TO SECOND EMBODIMENT

EXPLANATORY VIEW SHOWING EDGE PORTION OF SOS WAFER
ACCORDING TO SECOND EMBODIMENT

EXPLANATORY VIEW SHOWING METHOD FOR MANUFACTURING SOS WAFER ACCORDING TO THIRD EMBODIMENT

EXPLANATORY VIEW SHOWING EDGE PORTION OF SOS WAFER
ACCORDING TO THIRD EMBODIMENT

EXPLANATORY VIEW SHOWING METHOD FOR MANUFACTURING SOS WAFER ACCORDING TO FOURTH EMBODIMENT

EXPLANATORY VIEW SHOWING EDGE PORTION OF SOS WAFER ACCORDING TO FORTH EMBODIMENT

EXPLANATORY VIEW SHOWING METHOD FOR MANUFACTURING CONVENTIONAL SOS WAFER

METHOD FOR MANUFACTURING SILICON ON SAPPHIRE WAFER

This is a Divisional of U.S. application Ser. No. 11/377,394, filed on Mar. 17, 2006, now U.S. Pat. No. 7,564,100 and allowed on Apr. 6, 2009, the subject matter of which is incorporated herein by reference.

BACKGROUND OF THE INVENTION

The present invention relates to an SOS (Silicon On Sapphire) wafer corresponding to one wafer for manufacturing a semiconductor device, and its manufacturing method.

In a conventional SOS wafer, a silicon layer and an oxide layer are laminated over the front surface of a sapphire substrate of the SOS wafer. A polysilicon layer having non-transparency and an electrical characteristic and a silicon nitride layer which protects the polysilicon layer are provided over the back surface of the sapphire substrate, thereby enabling optical and electrical detection of the SOS wafer.

Such an SOS wafer is formed by a conventional manufacturing method shown in FIG. 9.

The conventional method for manufacturing the SOS wafer will be explained below in accordance with processes or process steps indicated by PZ using FIG. 9. Incidentally, FIG. 9 shows partial sections of the SOS wafer.

In PZ1, an SOS wafer 5 is prepared in which a silicon layer 3 and an oxide layer 4 comprised of silicon dioxide are laminated over a front surface 2 of a sapphire substrate 1.

Such a normal SOS wafer 5 is of a circular wafer having a diameter of 125 mm. The thickness of the sapphire substrate 1 is 640 μm, the thickness of the silicon layer 3 is 1000 Å, and the thickness of the oxide layer 4 is about 3600 Å.

Incidentally, the diameter and shape of the SOS wafer 5 are not limited to the above. The SOS wafer 5 may be a wafer having other dimensions and shape.

In PZ2, a 2.3 μm-thick polysilicon layer 7 is formed on the back surface 6 of the sapphire substrate 1 by using low-pressure chemical vapor deposition (LPCVD). Since the polysilicon layer 7 is grown using the low-pressure chemical vapor deposition in the present process step, a polysilicon layer 7 is similarly formed even on the front surface 2 side.

Incidentally, the drawing indicative of the present process step is shown with its obverse and reverse sides placed in reverse relationship to the drawing indicative of the process step PZ1. The front surface 2 side is not illustrated (the drawings indicative of the process steps of the prior art shown below are also same).

In PZ3, ions of an impurity such as phosphorus (P) are implanted in the corresponding polysilicon layer 7 to form a conductive diffusion region 8. This implantation is carried out to obtain conductivity of a silicon wafer in such a manner that an electrical sensor of a silicon wafer processing apparatus designed so as to detect the silicon wafer, based on the conductivity of the wafer is capable of detecting the SOS wafer 5.

The ions implanted in the present process step are P+ (atomic weight: 31), a dose thereof is $1\times10^{16}/cm^2$, and implantation energy is 175 keV. The amount of diffusion of the impurity into the polysilicon layer 7 on the back surface 6 side is determined depending on the dose of the phosphorus. The implantation energy can also be reduced to 25 keV or so.

After the implantation of the phosphorus, resistivity of the conductive diffusion region 8 is normally set to less than approximately 50Ω/square. This is because when the resistivity is set to 50Ω/square or more, the resistivity becomes excessively high to allow the silicon wafer processing apparatus to detect the SOS wafer 5 as the silicon wafer on the basis of its conductivity.

In PZ4, a 900 Å-thick silicon nitride layer 9 is formed on the polysilicon layers 7 on the front surface 2 side of the sapphire substrate 1 and on the back surface 6 side thereof.

The silicon nitride layer 9 is used as a protection layer for protecting the polysilicon layers 7 and the conductive diffusion region 8 during subsequent processing of the SOS wafer 5.

Incidentally, the thickness of the silicon nitride layer 9 may be set to a range from about 500 Å to about 5000 Å. The thickness of the silicon nitride layer 9 is selected so as to sufficiently protect the polysilicon layer 7 and the like from subsequent processing applied to the SOS wafer 5.

The shape of each edge portion 10 of the SOS wafer 5 formed in this way is shown in FIG. 10. Incidentally, FIG. 10 shows the front surface 2 side of the sapphire substrate 1 with being turned upward in a manner similar to the drawing indicative of the process step PZ1.

As shown in FIG. 10, the edge portion 10 of the SOS wafer 5 is covered with the polysilicon layer 7 and the silicon nitride layer 9. Although these layers are placed on the edge portions 10, they are unnecessary according to the preferred embodiment of the prior art.

Since the ion implantation is effected only on the back surface 6, although the front surface 2 side of the sapphire substrate 1 is also covered with the polysilicon layer 7 and the silicon nitride layer 9, the region like the conductive diffusion region 8 on which the ion implantation is effected, does not exist in the polysilicon layer 7 that covers the front surface 2 side and the edge portion 10.

The silicon nitride layer 9 and the polysilicon layer 7 formed on the front surface 2 side of the sapphire substrate 1 according to the process steps PZ2 and PZ4 are removed by reactive ion etching so that the lower oxide layer 4 is exposed. Processing of the SOS wafer 5 placed in this state by the silicon wafer processing apparatus is enabled.

In the SOS wafer 5 formed in this way, the polysilicon layer 7 formed on the back surface 6 side of the sapphire substrate 1 is non-transparent enough to detect the existence of the SOS wafer 5 by a photosensor. The thickness of the polysilicon layer 7 is the suitable minimum thickness based on an indirect bandgap absorption method, enough to detect a non-transparent object by the photosensor.

Incidentally, it is necessary to change the thickness of the polysilicon layer 7 to be grown, according to a photosensor system employed in the silicon wafer processing apparatus. It is also necessary to change it even depending upon the wavelength of used light. Red light and infrared radiation are used in the current silicon wafer processing apparatus and enough to optically detect the existence of the SOS wafer 5 according to the thickness of the polysilicon layer 7 on the back surface 6 side. When light of other wavelength is used, the thickness of the polysilicon layer 7 may be set to such a thickness that the SOS wafer 5 can be detected as a silicon wafer, according to the photosensor employed in the silicon wafer processing apparatus.

Further, in the SOS wafer 5 formed in the above-described manner, the conductive diffusion region 8 having conductivity obtained by ion-implanting phosphorus into the polysilicon layer 7 is formed on the back surface 6 side.

The manufacturing method of the prior art does not form such a contamination level or defect density as to exert an influence on yield on the front surface 2 side of the SOS wafer 5, in addition to the fact that optical characteristics and conductive characteristics are made equivalent to the silicon wafer.

The films formed on the back surface 6 side of the SOS wafer 5 are adapted to a subsequent silicon processing process. This adaptability is obtained according to the selection of the films and the order of deposition of their films. That is, the polysilicon layer 7 and the silicon nitride layer 9 are adapted to all subsequent heat treatments.

Further, the silicon nitride layer 9 corresponding to the outer film serves as a diffusion barrier which prevents the silicon layer 3 on the front surface 2 side of the SOS wafer 5 from being auto-doped with an impurity implanted in the back surface 6 side by diffusion thereof through the surface of nitride. Further, the silicon nitride layer 9 corresponding to the outer film is inert to all acids except for phosphoric acid at a high temperature, and the phosphoric acid is not used even in any step.

A conventional SOS wafer has been manufactured by such a manufacturing method as described above (refer to, for example, a patent document 1 (Japanese Patent No. 3083725 (paragraph 0011 in page 3—paragraph 0016 in page 4, and FIGS. 1 through 5)).

There is known, as a technique for preventing warpage of an SOS wafer, one which forms a polysilicon layer in a back surface of a sapphire substrate and pulls back its warpage produced by a silicon layer on its front surface by virtue of the polysilicon layer formed in the back surface (refer to, for example, Japanese Unexamined Patent Publication No. Sho 57 (1982)-153445 (lower right-hand section in page 2 and FIG. 2)).

There is also known a technique which thins a polysilicon layer to prevent warpage of an SOS wafer (refer to, for example, Japanese Unexamined Patent Publication No. 2000-36585 (paragraph 0015 in page 3 and FIG. 1)).

However, the technique of the patent document 1 referred to above is accompanied by problems that since silicon nitride layers are formed by low-pressure chemical vapor deposition, and the silicon nitride layer on the front surface side of a sapphire substrate is removed and the silicon nitride layer is provided so as to exist only in its back surface side, when they are used in processing of a silicon wafer processing apparatus, the front surface of the sapphire substrate is warped into convexity due to very large tensile stress developed in the silicon nitride layer formed by the low-pressure chemical vapor deposition, thus causing a failure in wafer vacuum chuck on the back surface side and a failure in transfer due to the warpage in a subsequent processing process of a semiconductor device, instability in a processing process for temperature ununiformity or the like at heat treatment, cracks of the SOS wafer, etc.

SUMMARY OF THE INVENTION

The present invention has been made to solve the above problems. It is an object of the present invention to provide means which prevents warpage of an SOS wafer whose processing is enabled in a normal silicon wafer processing apparatus.

According to one aspect of the present invention, for attaining the above object, there is provided an SOS wafer comprising a non-transparent polysilicon layer provided on a back surface of a sapphire substrate, a silicon nitride layer which protects the polysilicon layer, and a stress relaxing film which cancels out stress produced in the silicon nitride layer, wherein the silicon nitride layer and the stress relaxing film are provided on the back surface side.

Thus, the present invention brings about advantageous effects in that warpage and cracks of the SOS wafer in which the silicon nitride layer is provided on the back surface side of the sapphire substrate, can be prevented and the stability of a processing process of a semiconductor device in the normal silicon wafer processing apparatus can be ensured.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of an SOS wafer according to the present invention and its manufacturing method will hereinafter be described with reference to the accompanying drawings.

First Preferred Embodiment

Figure 1:
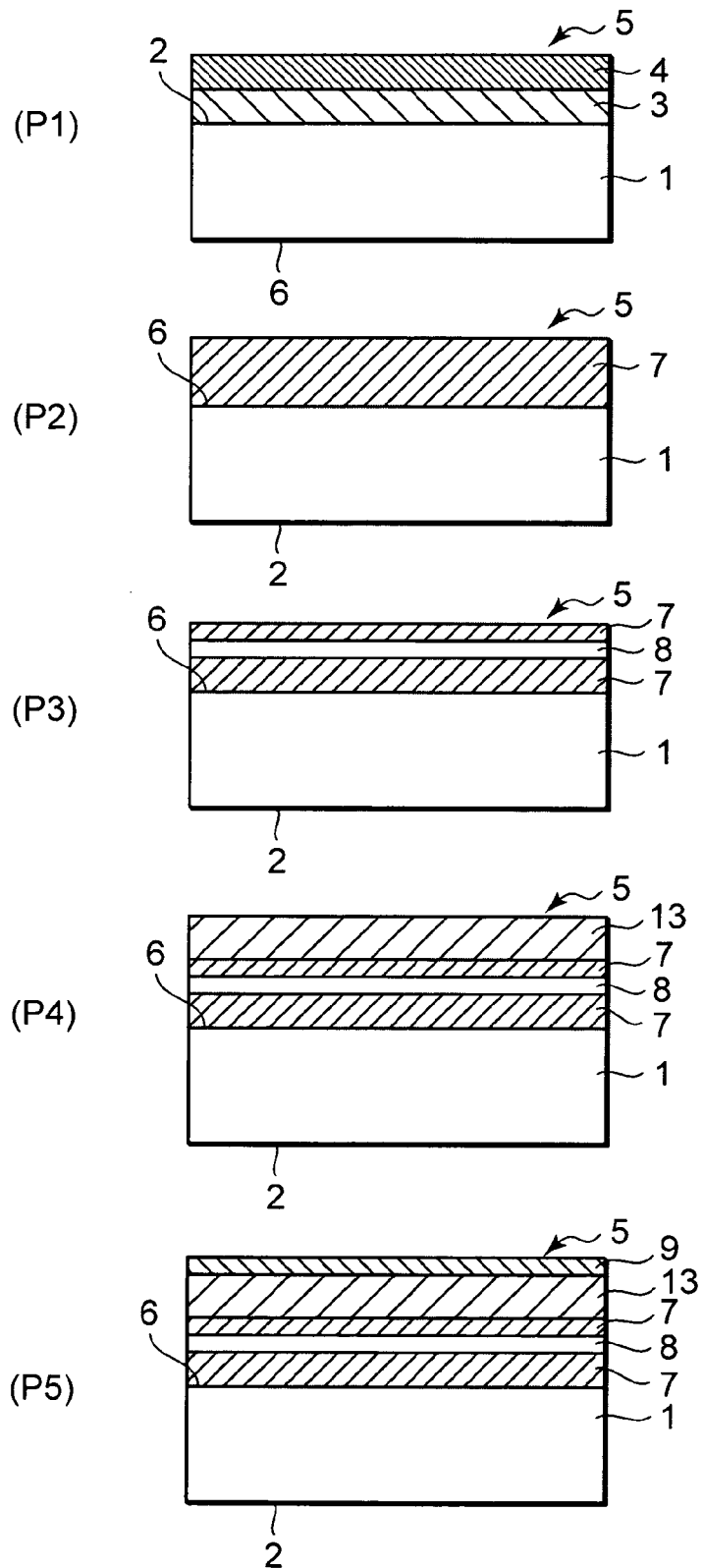
FIG. 1 is an explanatory view showing a method for manufacturing an SOS wafer according to a first embodiment.
Figure 2:
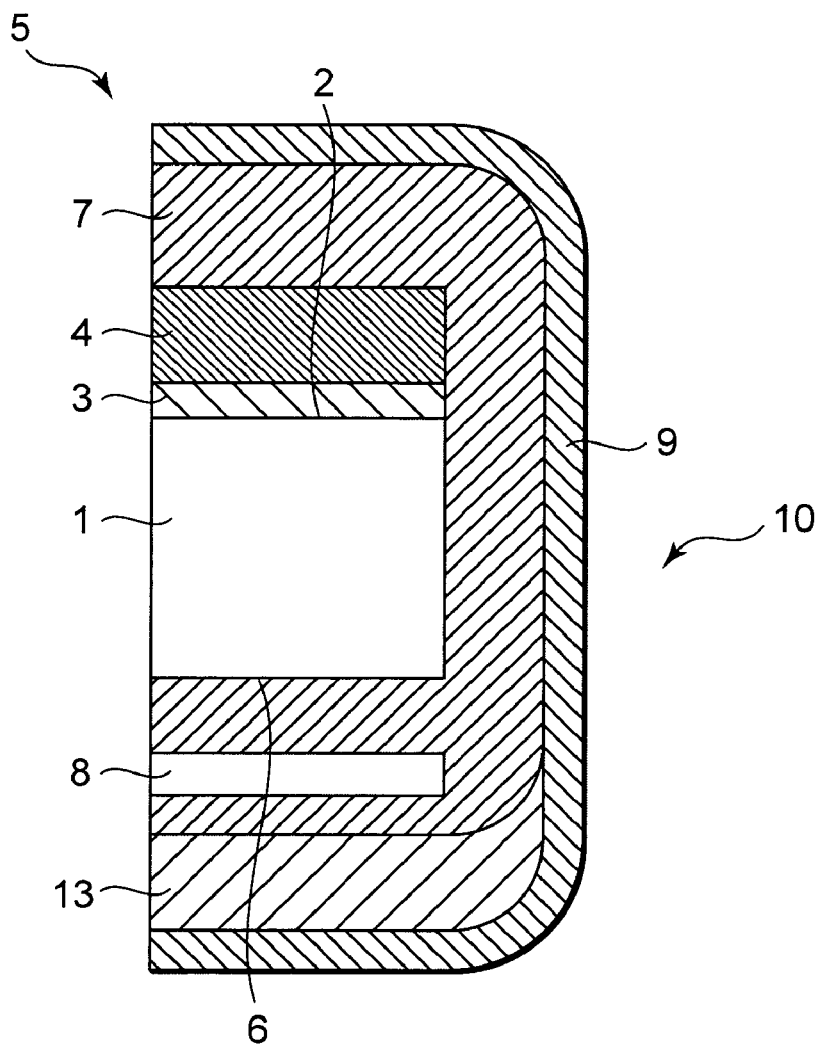
FIG. 2 is an explanatory view illustrating an edge portion of the SOS wafer according to the first embodiment.

FIG. 1 is an explanatory view showing a method for manufacturing an SOS wafer according to a first embodiment, and FIG. 2 is an explanatory view illustrating an edge portion of the SOS wafer according to the first embodiment, respectively.

Incidentally, constituent elements similar to those employed in the prior art are given the same reference numerals, and their explanations will therefore be omitted.

In FIG. 1, reference numeral 13 indicates a silicon nitride film used as a stress relaxing film, which is deposited or grown by a plasma CVD method using a parallel plate type plasma CVD (Chemical Vapor Deposition) apparatus.

A silicon layer 3 formed in a front surface 2 of a sapphire substrate 1 employed in the present embodiment is a silicon layer monocrystallized by epitaxial growth.

The method for manufacturing the SOS wafer according to the present embodiment will be explained below in accordance with processes or process steps indicated by P using FIG. 1.

Incidentally, FIG. 1 shows partial cross-sections of the SOS wafer, and FIG. 2 shows the front surface side of the sapphire substrate 1 as directed upward (this is similar in the drawings showing process steps of the present invention shown below and the drawings showing edge portions).

In P1, an SOS wafer 5 having a silicon layer 3 and an oxide layer 4 laminated over the front surface 2 of the sapphire substrate 1 similar to one in the process or process step PZ1 of the prior art, is prepared.

In P2, a polysilicon layer 7 similar to one in the process step PZ2 of the prior art is formed on the back surface 6 of the sapphire substrate 1 and the oxide layer 4 on the front surface 2 side thereof and at each edge portion 10 by low-pressure chemical vapor deposition.

Incidentally, the drawing indicative of the present process step is shown with its obverse and reverse sides placed in reverse relationship to the drawing indicative of the process step P1. The front surface 2 side is not illustrated (the drawings indicative of the process steps of the present invention shown below are also same).

In P3, ions of an impurity for applying conductivity to the polysilicon layer 7, such as phosphorus (P) are implanted into the polysilicon layer 7 on the back surface 6 of the sapphire substrate 1 to form a conductive diffusion region 8 similar to one in the process step PZ3 of the prior art.

In P4, a 1550 Å-thick silicon nitride film 13 is formed on the polysilicon layer 7 on the back surface 6 side of the sapphire substrate 1 by the plasma CVD method.

An RF plasma power supply of the parallel plate type plasma CVD apparatus at this time is 13.56 MHz, and its deposition conditions are a susceptor temperature of 400° C., an $SiH_4$ flow rate of 105 sccm, an $NH_3$ flow rate of 51 sccm, an $N_2$ flow rate of 1534 sccm, an RF power of 400 W, a pressure of 5 Torr, and an electrode-to-electrode distance of 8.9 mm.

Stress subsequent to the deposition of the silicon nitride film 13 grown under such deposition conditions is 0.6 Gpa as compressive stress.

An Si—H concentration determined from an infrared absorption peak of an infrared absorption spectrum of the silicon nitride film 13 is less than or equal to $10 \times 10^{21}/cm^3$, and a low wavenumber-end wavenumber of an Si—H absorption peak at infrared absorption is 1960/cm or more. Thus, the silicon nitride film 13 satisfies a condition for eliminating an inelastic behavior described in Japanese Patent No. 3043083 (called document 1), i.e., a condition for restoring the silicon nitride film 13 to the original stress state upon cooling subsequent to execution of thermal or heat treatment.

In P5, a 900 Å-thick silicon nitride layer 9 is formed on the front surface 2 side of the sapphire substrate 1 and over the polysilicon layer 7 of the edge portion 10 and the silicon nitride film 13 on the back surface 6 side by low-pressure chemical vapor deposition.

The shape of each edge portion 10 of the SOS wafer 5 formed in this way is configured as shown in FIG. 2. As shown in FIG. 2, the edge portion 10 of the SOS wafer 5 is covered with the polysilicon layer 7 and the silicon nitride layer 9. The polysilicon layer 7 on the front surface 2 side of the sapphire substrate 1, and the polysilicon layer 7 and the silicon nitride film 13 on the back surface 6 side are also covered with the silicon nitride layer 9.

Thereafter, the silicon nitride layer 9 and the polysilicon layer 7 formed on the front surface 2 side of the sapphire substrate 1 in accordance with the process steps P2 and P5 are removed by reactive ion etching to expose the lower oxide layer 4. In this condition, the processing of the SOS wafer 5 according to the present embodiment by a silicon wafer processing apparatus is enabled.

The oxide film 4 is removed by a processing step at the silicon wafer processing apparatus. In a backgrind process subsequent to the formation of a semiconductor device or the like in the silicon layer 3, the polysilicon layer 7 on the back surface 6 side, the conductive diffusion region 8 formed therein, the silicon nitride film 13 and the silicon nitride layer 9 are removed. The back surface 6 of the sapphire substrate 1 is exposed, followed by being divided into fractions, whereby a semiconductor device using the SOS wafer 5 according to the manufacturing method of the present embodiment is manufactured.

In the SOS wafer 5 formed by the manufacturing method of the present embodiment, the conductive diffusion region 8 is formed in the polysilicon layer 7 formed on the back surface 6 side of the sapphire substrate 1 to ensure non-transparency of the polysilicon layer 7. It is therefore possible to reliably detect the existence of the SOS wafer 5 by a photosensor.

Tensile stress subsequent to the deposition of the 900 Å-thick silicon nitride layer 9 formed by the low-pressure chemical vapor deposition in the process step P5 is 1 Gpa. Compressive stress subsequent to the deposition of the 1550 Å-thick silicon nitride film 13 formed by the plasma CVD method in the process step P4 is 0.6 Gpa. Therefore, the tensile stress of the silicon nitride layer 9 can be cancelled out by the compressive stress of the silicon nitride film 13 and hence no warpage occurs in the SOS wafer 5.

Further, since the silicon nitride film 13 formed in the process step P4 meets the condition of the document 1, the silicon nitride film 13 can be restored to the original post-deposition compressive stress state even if subjected to thermal treatment. Even though the silicon nitride film 13 is subjected to a deposition temperature of 700 to 800° C. at which the silicon nitride layer 9 is deposited by the low-pressure chemical vapor deposition in the process step P5, no change occurs in the compressive stress of the silicon nitride film 13 and no warpage occurs in the SOS wafer 5 after its heat treatment. Incidentally, if the deposition conditions described in the process step P4 are used, then the heat treatment of 700 to 800° C. causes no inelastic behavior.

Further, since the edge portion 10 and the polysilicon layer 7 and silicon nitride film 13 on the back surface 6 side are covered with the silicon nitride layer 9 inert to hydrofluoric acid, the polysilicon layer 7 and the silicon nitride film 13 are not eroded by hydrofluoric acid processing included in a cleaning step or the like in the processing process of the semiconductor device. Further, non-transparency is not impaired with erosion of the conductive diffusion region 8.

Furthermore, since the edge portion 10 and the polysilicon layer 7 on the back surface 6 side are covered with the silicon nitride layer 9, it is possible to prevent diffusion of impurities of the conductive diffusion region 8 into the silicon layer 3 on the front surface 2 side due to outward diffusion thereof. Further, no influence is exerted on the characteristic of the semiconductor device formed in the silicon layer 3.

In the present embodiment as described above, the tensile stress of the silicon nitride layer is set so as to be cancelled by the compressive stress based on the silicon nitride film. It is thus possible to prevent warpage and cracks of the SOS wafer in which the silicon nitride layer is provided on the back surface side of the sapphire substrate and to ensure the stability of the processing process of the semiconductor device at the normal silicon wafer processing apparatus.

With the formation of the silicon nitride film by the plasma CVD method, the silicon nitride film that causes the compressive stress can easily be formed, and the silicon nitride film can be grown only on the back surface side of the sapphire substrate, thus making it possible to achieve efficiency-enhancing of the process step for removing the polysilicon layer or the like on the front surface side of the sapphire substrate.

Further, since the silicon nitride film is deposited on the inelastic behavior-eliminating condition, the stress state of the silicon nitride film can always be restored to the original state after cooling in the heat treating or annealing step done after the formation of the silicon nitride film, and hence warpage and cracks of the SOS wafer subsequent to the heat treatment can be prevented.

Second Preferred Embodiment

Figure 3:
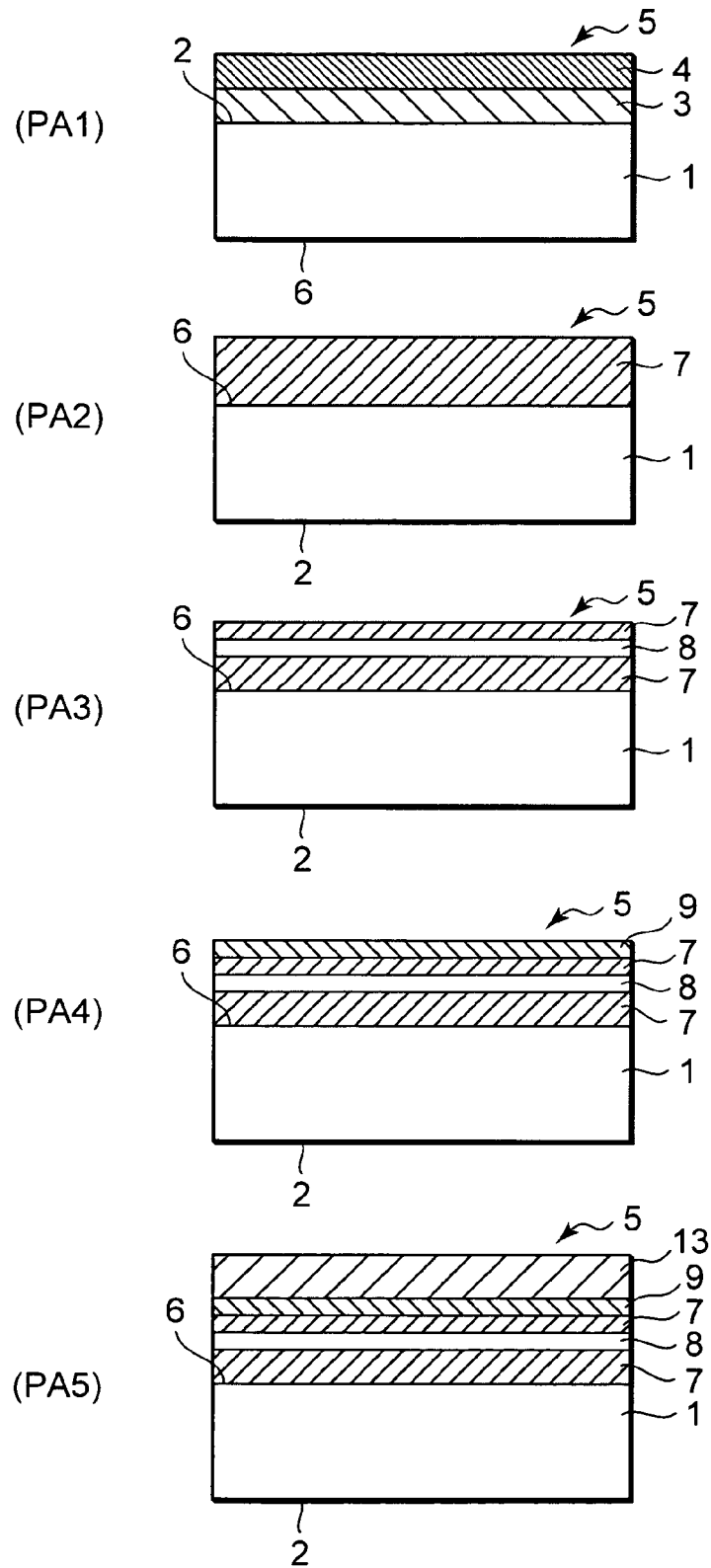
FIG. 3 is an explanatory view depicting a method for manufacturing an SOS wafer according to a second embodiment.
Figure 4:
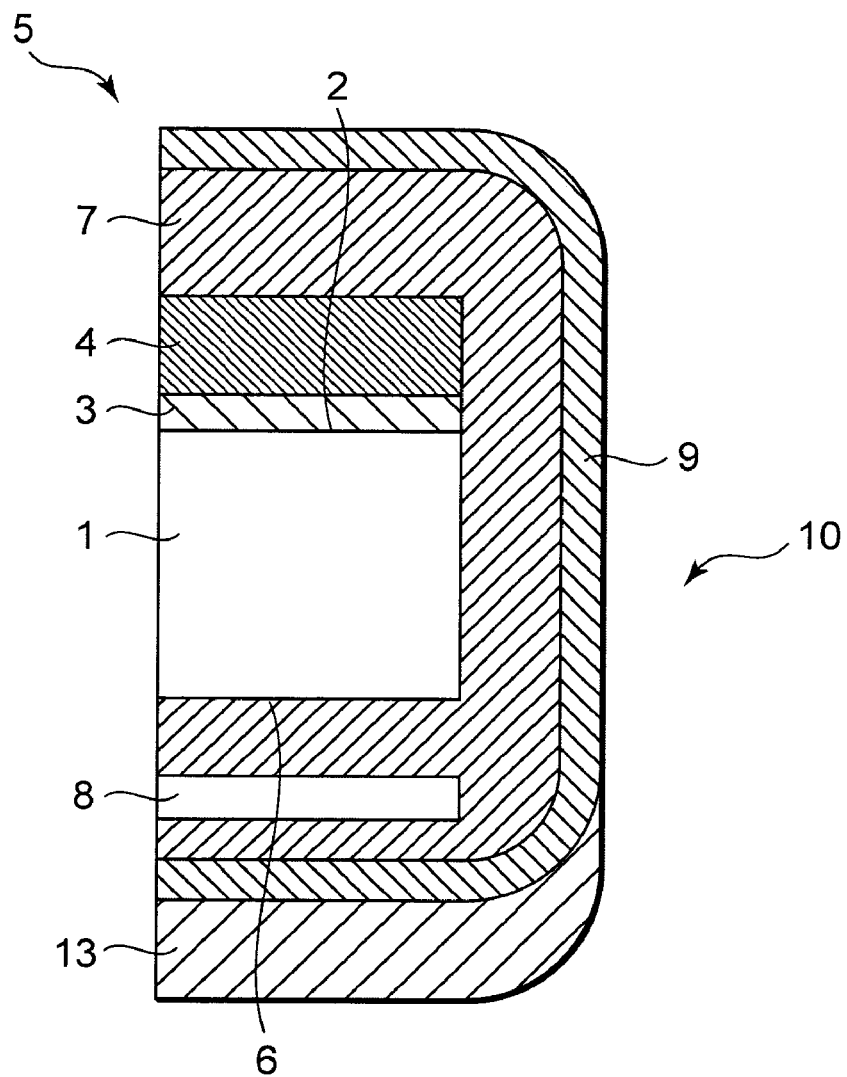
FIG. 4 is an explanatory view illustrating an edge portion of the SOS wafer according to the second embodiment.

FIG. 3 is an explanatory view showing a method for manufacturing an SOS wafer according to a second embodiment, and FIG. 4 is an explanatory view showing an edge portion of the SOS wafer according to the second embodiment, respectively.

Incidentally, constituent elements similar to those employed in the first embodiment are given the same reference numerals, and their explanations will therefore be omitted.

The method for manufacturing the SOS wafer according to the present embodiment will hereinafter be described in accordance with processes or process steps indicated by PA using FIG. 3.

In PA1, an SOS wafer 5 in which a silicon layer 3 and an oxide layer 4 are laminated over a front surface 2 of a sapphire substrate 1, is prepared in a manner similar to the process step P1 of the first embodiment.

In PA2, a polysilicon layer 7 is formed over a back surface 6 of the sapphire substrate 1 and the oxide layer 4 on the front surface 2 side and at each edge portion 10 in a manner similar to the process step P2 of the first embodiment.

In PA3, a conductive diffusion region 8 is formed in the polysilicon layer 7 placed on the back surface 6 of the sapphire substrate 1 in a manner similar to the process step P3 of the first embodiment.

In PA4, a 900 Å-thick silicon nitride layer 9 is formed over each of the polysilicon layers 7 on the front surface 2 side of the sapphire substrate 1, the back surface 6 side thereof and at the edge portions 10 thereof by low-pressure chemical vapor deposition.

In PA5, a 1550 Å-thick silicon nitride film 13 is formed on the silicon nitride layer 9 on the back surface 6 side of the sapphire substrate 1 on the conditions similar to the process step P4 of the first embodiment by a plasma CVD method.

The shape of the edge portion 10 of the SOS wafer 5 formed in this way is configured as shown in FIG. 4. As shown in FIG. 4, the edge portion 10 of the SOS wafer 5 is covered with the polysilicon layer 7 and the silicon nitride layer 9. The polysilicon layers 7 on the front surface 2 side and back surface 6 side of the sapphire substrate 1 are also covered with the silicon nitride layer 9, and a silicon nitride film 13 is formed on the silicon nitride layer 9 on the back surface 6 side.

Thereafter, the silicon nitride layer 9 and the polysilicon layer 7 formed on the front surface 2 side of the sapphire substrate 1 in accordance with the process steps PA2 and PA4 are removed in a manner similar to the first embodiment. Thus, processing of the SOS wafer 5 of the present embodiment by a silicon wafer processing apparatus is enabled.

The removal of the oxide layer 4 and the removal or the like of the silicon nitride film 13 or the like in a backgrind process are carried out in a manner similar to the first embodiment, and a semiconductor device using the SOS wafer 5 formed by the manufacturing method of the present embodiment is manufactured.

In the SOS wafer 5 formed by the manufacturing method of the present embodiment, non-transparency similar to the first embodiment is ensured at the polysilicon layer 7 on the back surface 6 side of the sapphire substrate 1. It is therefore possible to reliably detect the existence of the SOS wafer 5 by a photosensor.

Tensile stress subsequent to the deposition of the 900 Å-thick silicon nitride layer 9 formed by the low-pressure chemical vapor deposition in the process step PA4 is 1 Gpa. Compressive stress subsequent to the deposition of the 1550 Å-thick silicon nitride film 13 formed by the plasma CVD method in the process step PA5 is 0.6 Gpa. Therefore, the tensile stress of the silicon nitride layer 9 can be cancelled out by the compressive stress of the silicon nitride film 13 in a manner similar to the first embodiment, and hence no warpage occurs in the SOS wafer 5.

Since the silicon nitride film 13 is formed in the process step PA5 after the formation of the silicon nitride layer 9 in the process step PA4, the silicon nitride film 13 is insensitive to heat treatment at the formation of the silicon nitride layer 9 by the low-pressure chemical vapor deposition. Incidentally, the silicon nitride film 13 is grown so as to meet the condition of the document 1 in the process step PA5 because heat treatment in a subsequent process for processing a semiconductor device is taken into consideration. Since a restriction based on the condition of the document 1 is not placed if the heat treatment in the subsequent processing process is a relatively low temperature, the range for the condition of deposition of the silicon nitride film 13 can be enlarged.

Further, since the edge portion 10 and the polysilicon layer 7 on the back surface 6 side are covered with the silicon nitride layer 9 inert to hydrofluoric acid, the polysilicon layer 7 is not eroded by hydrofluoric acid processing, and non-transparency is not impaired with erosion of the conductive diffusion region 8.

Furthermore, since the edge portion 10 and the polysilicon layer 7 on the back surface 6 side are covered with the silicon nitride layer 9, impurities of the conductive diffusion region 8 can be prevented from being diffused outward and hence no influence is exerted on the characteristic of the semiconductor device formed in the silicon layer 3.

In the present embodiment as described above, the silicon nitride film is formed after the formation of the silicon nitride layer in addition to an advantageous effect similar to the first embodiment. It is thus possible to avoid the influence exerted on the silicon nitride film due to the heat treatment at the formation of the silicon nitride layer.

Third Preferred Embodiment

Figure 5:
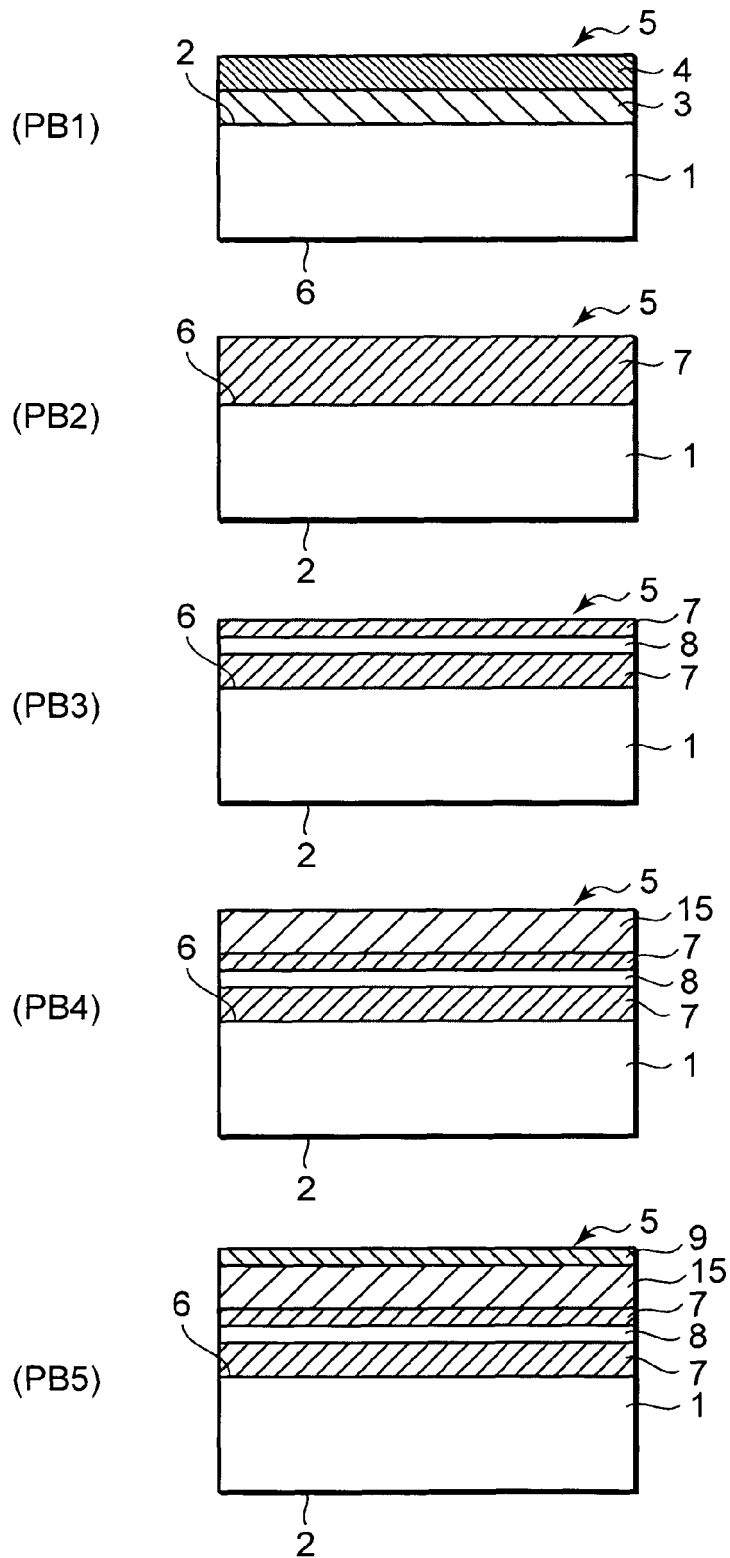
FIG. 5 is an explanatory view depicting a method for manufacturing an SOS wafer according to a third embodiment.
Figure 6:
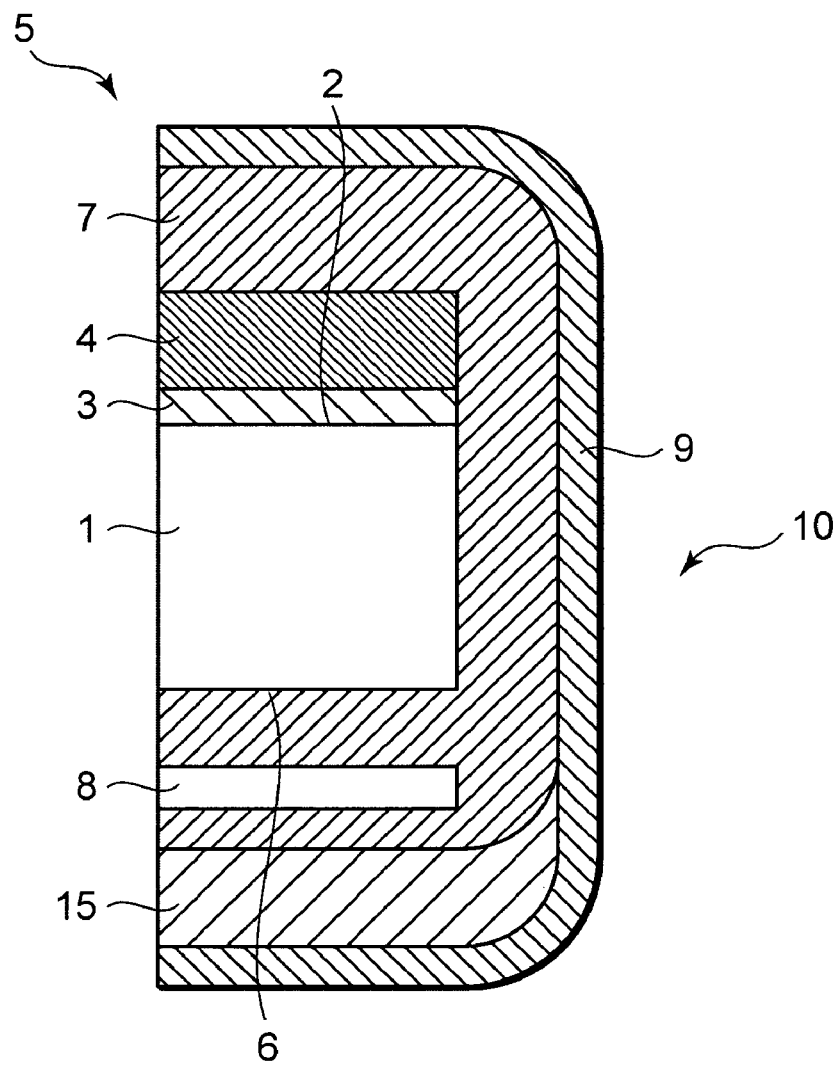
FIG. 6 is an explanatory view showing an edge portion of the SOS wafer according to the third embodiment.

FIG. 5 is an explanatory view showing a method for manufacturing an SOS wafer according to a third embodiment, and FIG. 6 is an explanatory view showing an edge portion of the SOS wafer according to the third embodiment, respectively.

Incidentally, constituent elements similar to those employed in the first embodiment are given the same reference numerals, and their explanations will therefore be omitted.

In FIG. 5, reference numeral 15 indicates a silicon oxide film used as a stress relaxing film, which is deposited by a plasma CVD method using a parallel plate type plasma CVD apparatus.

The method for manufacturing the SOS wafer of the present embodiment will be explained below in accordance with processes or process steps indicated by PB using FIG. 5.

Since the process steps PB1 through PB3 of the present embodiment are similar to the process steps P1 through P3 of the first embodiment, their explanations are omitted.

In PB4, a 10000 Å-thick silicon oxide film 15 is formed on a polysilicon layer 7 on the back surface 6 side of a sapphire substrate 1 by the plasma CVD method.

An RF plasma power supply of a parallel plate type plasma CVD apparatus at this time is 13.56 MHz, and its deposition conditions are as follows: a susceptor temperature of 400° C., a TEOS bubbling $N_2$ flow rate of 330 sccm, an $O_2$ flow rate of 730 sccm, an RF power of 390 W, a pressure of 10 Torr, and an electrode-to-electrode distance of 4.7 mm.

Stress subsequent to the deposition of the silicon oxide film 15 grown under such deposition conditions is 0.13 Gpa as compressive stress.

An Si—H absorption coefficient determined from an infrared absorption spectrum of the silicon oxide film 15 is less than or equal to $1.5 \times 10^2$/cm. The silicon oxide film 15 satisfies a condition under which moisture is not allowed to penetrate, which is described in Japanese Unexamined Patent Publication No. Hei 5 (1993)-291411 (called a document 2).

Incidentally, although the document 2 shows the invention related to permeability to moisture, it has been found out that when the silicon oxide film 15 is grown by reference to the deposition conditions of the patent document 2 upon completion of the present invention, there is a correlation even with respect to stress and the inelastic behavior of the silicon oxide film 15 due to heat treatment can be reduced. Therefore, the present deposition conditions were used as the conditions for restoring the silicon oxide film 15 to substantially the original stress state upon cooling subsequent to execution of the heat treatment.

In PB5, a 900 Å-thick silicon nitride layer 9 is formed on the front surface 2 side of the sapphire substrate 1 and over the polysilicon layer 7 of each edge portion 10 and the silicon oxide film 15 on the back surface 6 side of the sapphire substrate 1 by low-pressure chemical vapor deposition.

The shape of each edge portion 10 of the SOS wafer 5 formed in this way is configured as shown in FIG. 6. As shown in FIG. 6, the edge portion 10 of the SOS wafer 5 is covered with the polysilicon layer 7 and the silicon nitride layer 9. The polysilicon layer 7 on the front surface 2 side of the sapphire substrate 1, and the polysilicon layer 7 and silicon oxide film 15 on the back surface 6 side of the sapphire substrate 1 are also respectively covered with the silicon nitride layer 9.

Thereafter, the silicon nitride layer 9 and the polysilicon layer 7 formed on the front surface 2 side of the sapphire substrate 1 in accordance with the process steps PB2 and PB5 are removed in a manner similar to the first embodiment. Thus, processing of the SOS wafer 5 of the present embodiment by a silicon wafer processing apparatus is enabled.

The removal of the oxide layer 4 and the removal or the like of the silicon oxide film 15 or the like in a backgrind process are carried out in a manner similar to the first embodiment, and a semiconductor device using the SOS wafer 5 formed by the manufacturing method of the present embodiment is manufactured.

In the SOS wafer 5 formed by the manufacturing method of the present embodiment, non-transparency similar to the first embodiment is ensured at the polysilicon layer 7 on the back surface 6 side of the sapphire substrate 1. It is therefore possible to reliably detect the existence of the SOS wafer 5 by a photosensor.

Tensile stress subsequent to the deposition of the 900 Å-thick silicon nitride layer 9 formed by the low-pressure chemical vapor deposition in the process step PB5 is lGpa. Compressive stress subsequent to the deposition of the 10000 Å-thick silicon oxide film 15 formed by the plasma CVD method in the process step PB4 is 0.13 Gpa. Therefore, stress exceeding the tensile stress of the silicon nitride layer 9, which is cancelled out by the compressive stress of the silicon oxide film 15, is reached. Since, however, the inelastic behavior remains although small as described above, the compressive stress is reduced from 0.13 Gpa to 0.1 Gpa when the silicon oxide film is subjected to a deposition temperature of 700 to 800° C. at which the silicon nitride layer is deposited by the low-pressure chemical vapor deposition in the process step PB5. It is therefore possible to cancel the tensile stress of the silicon nitride layer 9 by the post-cooling compression stress in the heat treatment of the process step PA5.

Thus, when the inelastic behavior remains in the compressive stress, the tensile stress and compressive stress produced by the silicon nitride layer 9 and the silicon oxide film 15 can be matched with each other after heat treatment if the deposition conditions are set in expectation of its change, and hence no warpage occurs in the SOS wafer 5.

Further, since each edge portion 10 and the polysilicon layer 7 on the back surface 6 side are covered with the silicon nitride layer 9 inert to hydrofluoric acid, the polysilicon layer 7 is not eroded by hydrofluoric acid processing and non-transparency is not impaired with erosion of the conductive diffusion region 8.

Further, since the edge portion 10 and the polysilicon layer 7 on the back surface 6 side are covered with the silicon nitride layer 9, outward diffusion of impurities of the conductive diffusion region 8 can be prevented and hence no influence is exerted on the characteristic of a semiconductor device formed in a silicon layer 3.

In the present embodiment as described above, an advantageous effect similar to the first embodiment can be obtained even when the silicon oxide film is used.

That is, the tensile stress of the silicon nitride layer is cancelled by the compressive stress produced by the silicon oxide film, after the formation of the silicon nitride layer. It is thus possible to prevent warpage and cracks of the SOS wafer in which the silicon nitride layer is provided on the back surface side of the sapphire substrate and to ensure the stability of the processing process of the semiconductor device at the normal silicon wafer processing apparatus.

With the formation of the silicon oxide film by the plasma CVD method, the silicon oxide film that causes the compressive stress can easily be formed, and the silicon oxide film can be grown only on the back surface side of the sapphire substrate, thus making it possible to achieve efficiency-enhancing of the process step for removing the polysilicon layer or the like on the front surface side of the sapphire substrate.

Further, since the silicon oxide film is deposited on the inelastic behavior-reducing condition, a change in stress of the silicon oxide film, which is developed after cooling in the heat treating step carried out after the formation of the silicon oxide film, can easily be expected. Warpage and cracks of the SOS wafer subsequent to the heat treatment can be prevented.

Fourth Preferred Embodiment

Figure 7:
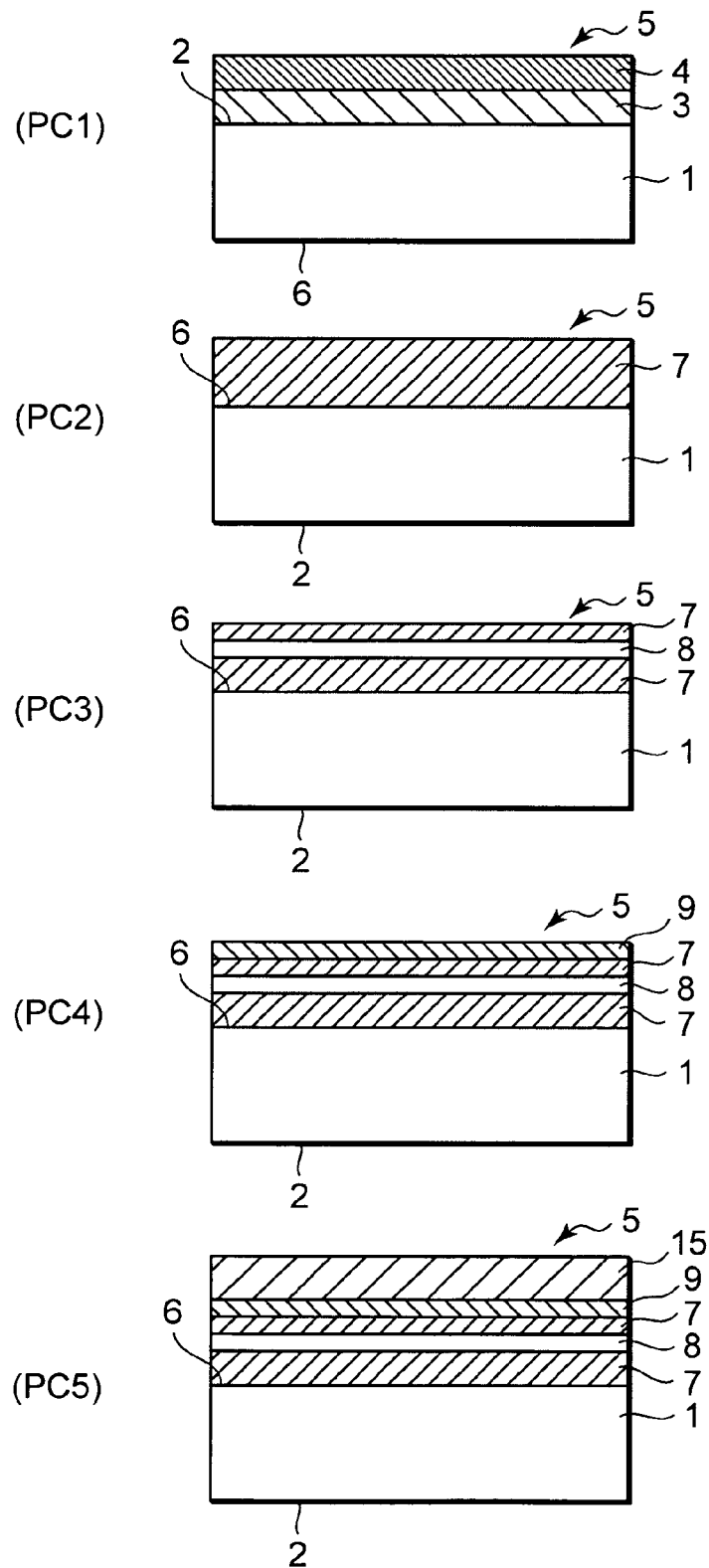
FIG. 7 is an explanatory view depicting a method for manufacturing an SOS wafer according to a fourth embodiment.
Figure 8:
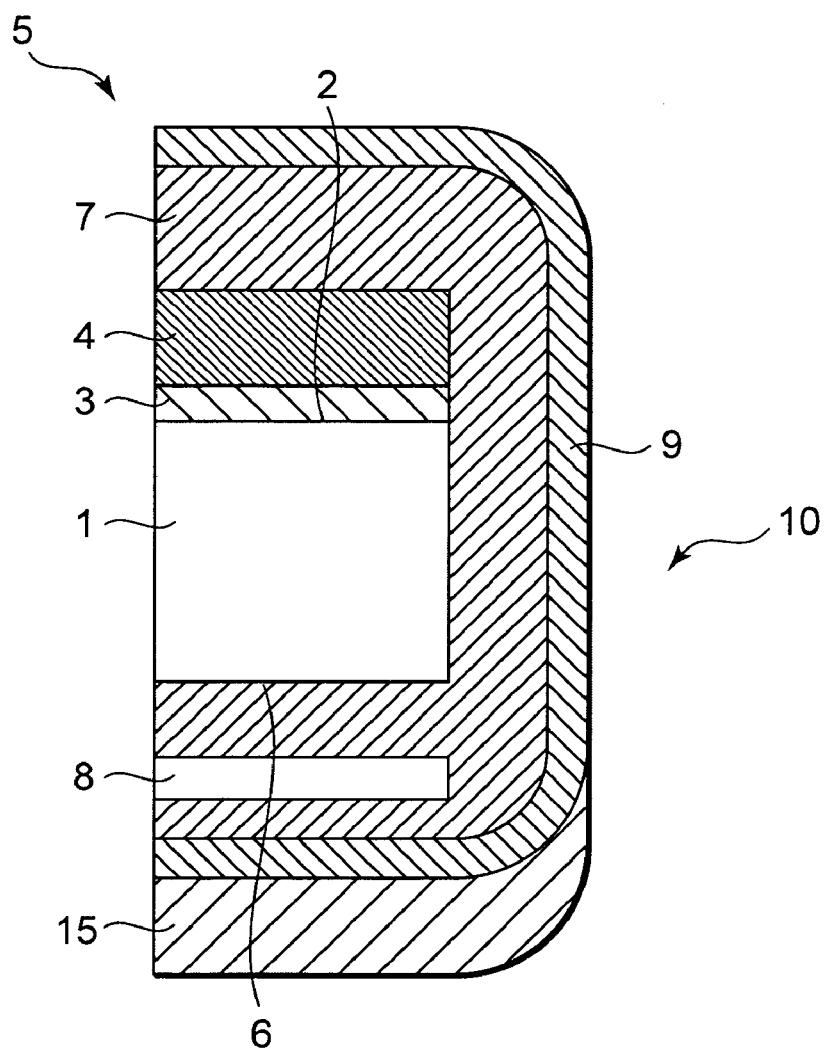
FIG. 8 is an explanatory view showing an edge portion of the SOS wafer according to the fourth embodiment.
Figure 9:
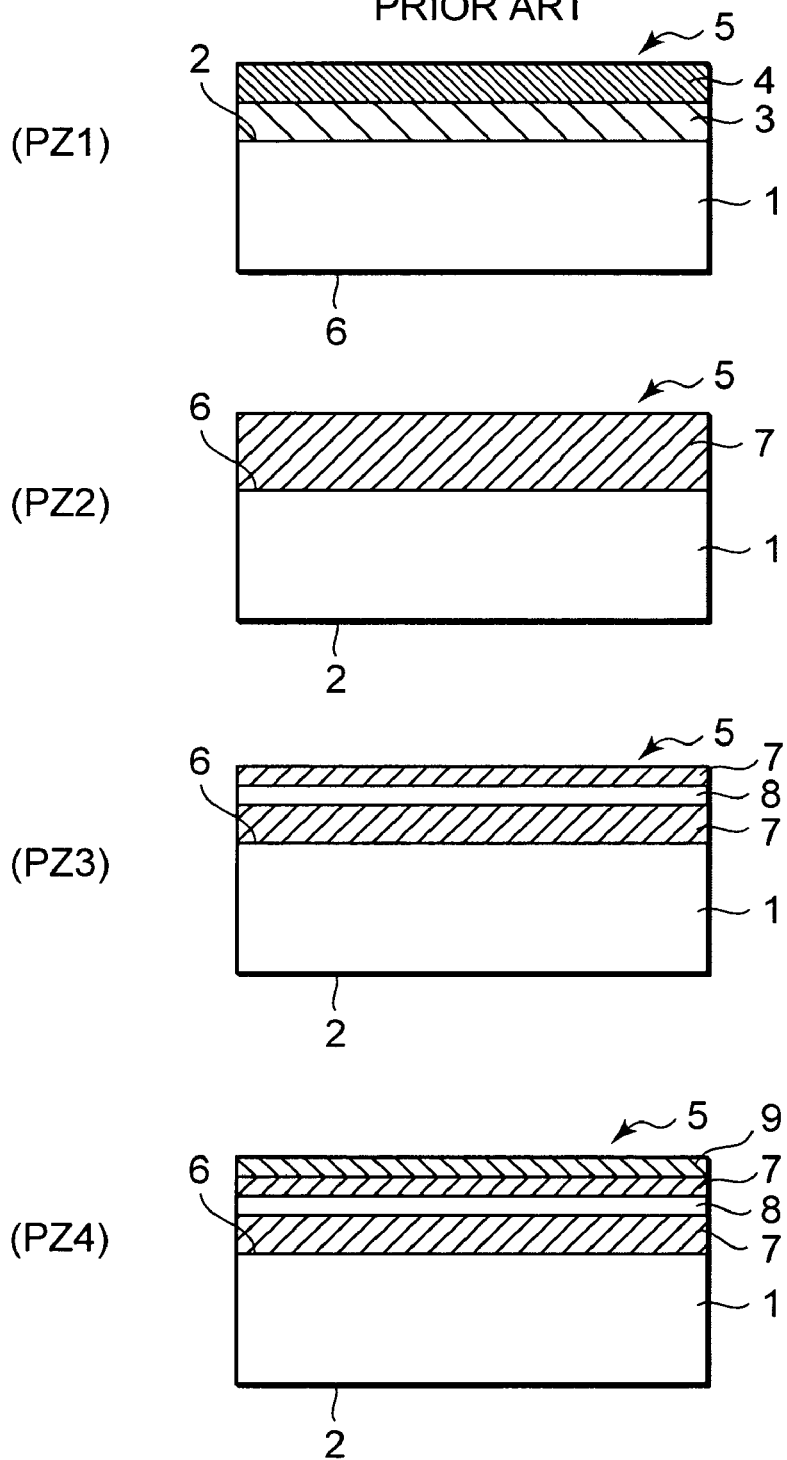
FIG. 9 is an explanatory view illustrating a method for manufacturing a conventional SOS wafer.
Figure 10:
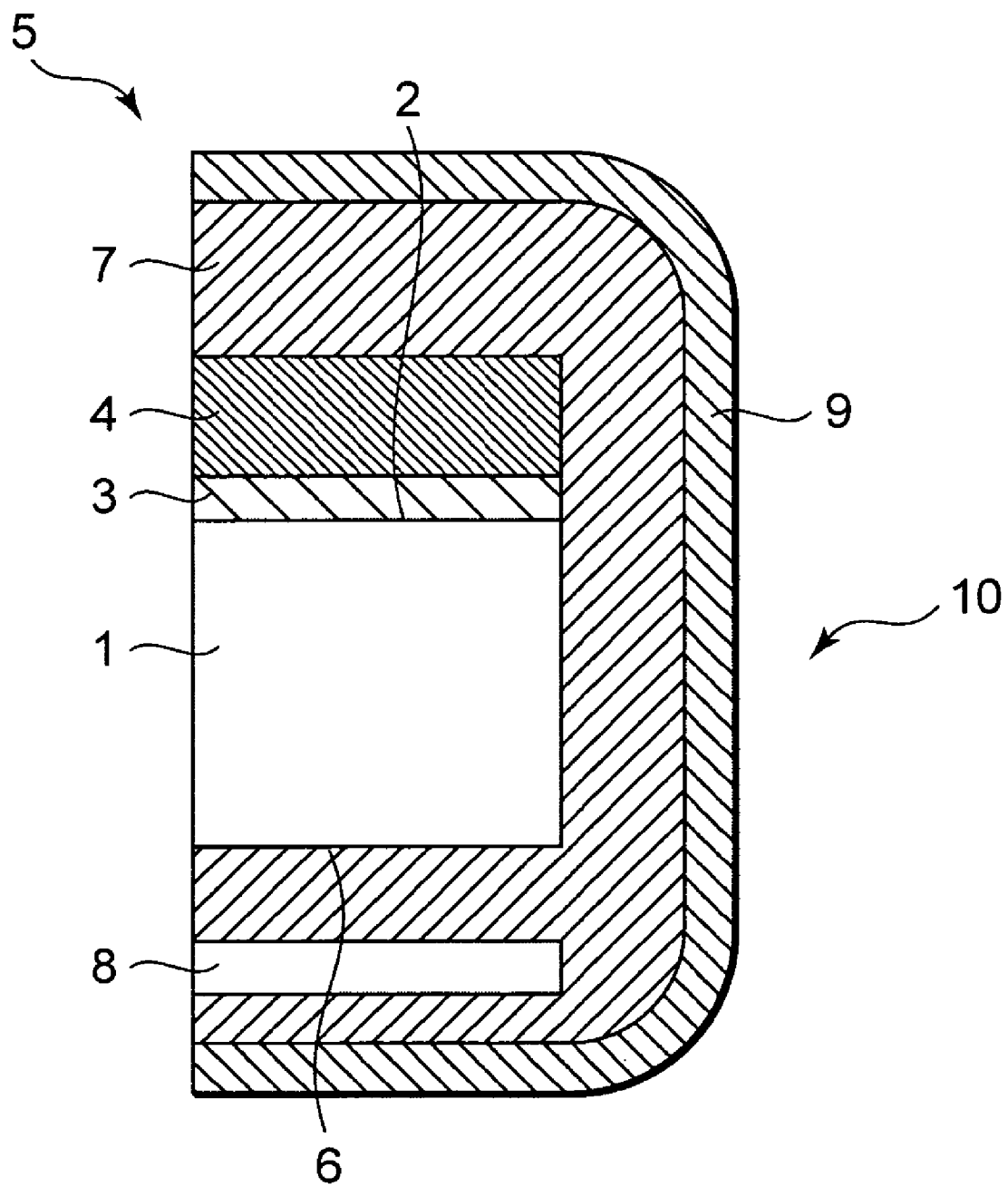
FIG. 10 is an explanatory view showing an edge portion of the conventional SOS wafer.

FIG. 7 is an explanatory view showing a method for manufacturing an SOS wafer according to a fourth embodiment, and FIG. 8 is an explanatory view showing an edge portion of the SOS wafer according to the fourth embodiment, respectively.

Incidentally, constituent elements similar to those employed in the third embodiment are given the same reference numerals, and their explanations will therefore be omitted.

The method for manufacturing the SOS wafer according to the present embodiment will be explained below in accordance with processes or process steps indicated by PC using FIG. 7.

Since the process steps PC1 through PC4 of the present embodiment are similar to the process steps PA1 through PA4 of the second embodiment, their explanations are omitted.

In PC5, a 8000 Å-thick silicon oxide film 15 is formed on a silicon nitride layer 9 on the back surface 6 side of a sapphire substrate 1 by a plasma CVD method on the condition similar to the process step PB4 of the third embodiment.

The shape of each edge portion 10 of the SOS wafer 5 formed in this way is configured as shown in FIG. 8. As shown in FIG. 8, the edge portion 10 of the SOS wafer 5 is covered with a polysilicon layer 7 and the silicon nitride layer 9. The polysilicon layers 7 on the front surface 2 side and back surface 6 side of the sapphire substrate 1 are also covered with the silicon nitride layer 9, and a silicon oxide film 15 is formed on the silicon nitride layer 9 on the back surface 6 side.

Thereafter, the silicon nitride layer 9 and the polysilicon layer 7 formed on the front surface 2 side of the sapphire substrate 1 in accordance with the process steps PC2 and PC4 are removed in a manner similar to the first embodiment. Thus, processing of the SOS wafer 5 of the present embodiment by a silicon wafer processing apparatus is enabled.

The removal of an oxide layer 4 and the removal or the like of the silicon oxide film 15 or the like in a backgrind process are carried out in a manner similar to the first embodiment, and a semiconductor device using the SOS wafer 5 formed by the manufacturing method of the present embodiment is manufactured.

In the SOS wafer 5 formed by the manufacturing method of the present embodiment, non-transparency similar to the first embodiment is ensured at the polysilicon layer 7 on the back surface 6 side of the sapphire substrate 1. It is therefore possible to reliably detect the existence of the SOS wafer 5 by a photosensor.

Tensile stress subsequent to the deposition of the 900 Å-thick silicon nitride layer 9 formed by low-pressure chemical vapor deposition in the process step PC4 is 1 Gpa. Compressive stress subsequent to the deposition of the 8000 Å-thick silicon oxide film 15 formed by the plasma CVD method in the process step PC5 is 0.13 Gpa. Therefore, the tensile stress of the silicon nitride layer 9 can be cancelled out by the compressive stress of the silicon oxide film 15 in a manner similar to the first embodiment, and hence no warpage occurs in the SOS wafer 5.

Since the silicon oxide film 15 is formed in the process step PC5 after the formation of the silicon nitride layer 9 in the process step PC4, the silicon oxide film 15 is insensitive to heat treatment at the formation of the silicon nitride layer 9 by the low-pressure chemical vapor deposition. Therefore, the thickness of the silicon oxide film 15 was made thin like 8000 Å. Incidentally, the silicon oxide film 15 is grown so as to meet the condition of the document 2 in the process step PC5 because heat treatment in a subsequent process for processing a semiconductor device is taken into consideration. Since a restriction based on the condition of the document 2 is not placed if the heat treatment in the subsequent processing process is placed at a relatively low temperature, the range for the condition of deposition of the silicon oxide film 15 can be enlarged.

Further, since the edge portion 10 and the polysilicon layer 7 on the back surface 6 side are covered with the silicon nitride layer 9 inert to hydrofluoric acid, the polysilicon layer 7 is not eroded by hydrofluoric acid processing, and non-transparency is not impaired with erosion of a conductive diffusion region 8.

Furthermore, since the edge portion 10 and the polysilicon layer 7 on the back surface 6 side are covered with the silicon nitride layer 9, outward diffusion of impurities of the conductive diffusion region 8 can be prevented and hence no influence is exerted on the characteristic of a semiconductor device formed in a silicon layer 3.

Incidentally, since the etching rate of the silicon oxide film 15 with respect to hydrofluoric acid is relatively large as compared with the silicon nitride film 13, a reduction in the thickness due to the hydrofluoric acid processing included in a subsequent cleaning step or the like must be taken into consideration. However, in consideration of the fact that a step for making the stability of the SOS wafer 5 important exists before the first hydrofluoric acid processing in a subsequent processing process, priority is given to a reduction in the amount of warpage in that step, and the thickness of the silicon oxide film 15 was set to 8000 Å.

In the present embodiment as described above, the silicon oxide film is formed after the formation of the silicon nitride layer in addition to an advantageous effect similar to the third embodiment. It is thus possible to avoid the influence of heat treatment at the formation of the silicon nitride layer on the silicon oxide film.

Incidentally, although each of the above embodiments has explained by way of example, the specific thicknesses of the silicon nitride film and silicon oxide film as the stress relaxing films necessary to cancel the tensile stress of the silicon nitride layer, the thicknesses of the silicon nitride film and the silicon oxide film need to be changed according to the thickness of the silicon nitride layer and the tensile stress produced therein. That is, it is important that the thickness of each of the silicon nitride film and the silicon oxide film is determined on the basis of the compressive stress developed in each of the silicon nitride film and silicon oxide film formed as the stress relaxing films, so as to reach the compressive force or stress that becomes equivalent to the tensile force or stress obtained according to the tensile stress and thickness of the silicon nitride layer.

Although each of the above embodiments has explained as an example, the case in which the silicon nitride layer produces the tensile stress, a similar effect can be obtained if the silicon nitride film or the like used as the stress relaxing film that produces the tensile stress is used, similarly even where the silicon nitride layer produces the compressive stress.

While the preferred forms of the present invention have been described, it is to be understood that modifications will be apparent to those skilled in the art without departing from the spirit of the invention. The scope of the invention is to be determined solely by the following claims.

What is claimed is:

1. A method for manufacturing an SOS wafer provided with a sapphire substrate, comprising:
   forming a polysilicon layer over the sapphire substrate;
   implanting an impurity, for applying conductivity in a polysilicon layer, on a back surface side of the sapphire substrate to form a conductive diffusion region;
   forming a silicon nitride layer for protecting the polysilicon layer, on the back surface side of the sapphire substrate; and forming a stress relaxing film for canceling stress of the silicon nitride layer, on the back surface side of the sapphire substrate;

wherein said stress relaxing film forming step is performed prior to said silicon nitride layer forming step;

wherein when the silicon nitride layer is in a tensile stress state, said stress relaxing film forming step is set as a step for forming a silicon nitride film by a plasma CVD method; and wherein an Si—H concentration determined from an infrared absorption peak of the silicon nitride film is less than or equal to $10 \times 10^{21}/cm^3$, and a low wavenumber-end wavenumber of an Si—H absorption peak at infrared absorption of the silicon nitride film is greater than or equal to 1960/cm.

\* \* \* \* \*